(12) United States Patent
Dupraz et al.

(10) Patent No.: US 7,825,763 B2
(45) Date of Patent: Nov. 2, 2010

(54) CURRENT TRANSFORMER WITH ROGOWSKI TYPE WINDINGS, COMPRISING AN ASSOCIATION OF PARTIAL CIRCUITS FORMING A COMPLETE CIRCUIT

(75) Inventors: Jean-Pierre Dupraz, Bressolles (FR); Lionel Lucot, Fleurieux (FR); Olivier Chuniaud, Chambery (FR); Bernard Regnier, Trevignin (FR)

(73) Assignee: Areva T&D SA, Paris (FR)

( * ) Notice: Subject to any disclaimer, the term of this patent is extended or adjusted under 35 U.S.C. 154(b) by 0 days.

(21) Appl. No.: 11/124,034

(22) Filed: May 6, 2005

(65) Prior Publication Data
US 2005/0248430 A1  Nov. 10, 2005

(30) Foreign Application Priority Data
May 10, 2004  (FR) .................................. 04 50897

(51) Int. Cl.
*H01F 38/20* (2006.01)
(52) U.S. Cl. ........................ 336/174; 336/225
(58) Field of Classification Search ................ 336/174
See application file for complete search history.

(56) References Cited

U.S. PATENT DOCUMENTS 5,414,400 A * 5/1995 Gris et al. .................... 336/174
2003/0137388 A1 * 7/2003 Meier et al. ................. 336/225

FOREIGN PATENT DOCUMENTS

| DE | 44 24 368 | 7/1995 |
| DE | 44 24 368 A1 | 7/1995 |
| DE | 101 61 370 | 8/2002 |
| EP | 0 573 350 A1 | 6/1993 |
| EP | 0 573 350 | 12/1993 |
| EP | 0 587 491 | 3/1994 |
| EP | 0 587 491 A1 | 3/1994 |
| JP | 2000065866 A * | 8/1998 |
| JP | 2000-147023 | 5/2000 |

OTHER PUBLICATIONS

Patent Abstracts of Japan, JP 2000-147023, May 2000.

* cited by examiner

*Primary Examiner*—Elvin G Enad
*Assistant Examiner*—Joselito Baisa
(74) *Attorney, Agent, or Firm*—Pearne & Gordon LLP

(57) ABSTRACT

The current transformer comprises at least two partial circuits ($CB_n$) each comprising a Rogowski type winding ($C_n$), each of said the partial circuits being made in the form of an angular portion of a complete circuit (CB) which surrounds at least one primary conductor (10, 10A, 10B, 10C) of the transformer over 360°. The winding ($C_n$) of each partial circuit ($CB_n$) is constituted by a go winding ($C_{n0}$) and by a return winding ($C_{n1}$) which extend over the angular extent ($\theta_n$) of the partial circuit ($CB_n$). For each partial circuit ($CB_n$), the go and return windings are electrically connected in series, both having turns wound in the same direction so as to form a single winding ($C_n$) which presents a pair of adjacent electrical terminations ($T_{1n}$, $T_{2n}$) connected to an acquisition system (7, 7').

24 Claims, 4 Drawing Sheets

CURRENT TRANSFORMER WITH ROGOWSKI TYPE WINDINGS, COMPRISING AN ASSOCIATION OF PARTIAL CIRCUITS FORMING A COMPLETE CIRCUIT

TECHNICAL FIELD

The invention relates to a current transformer comprising at least two partial circuits each comprising a Rogowski type winding, each of the partial circuits being made in the form of an angular portion of a complete circuit surrounding the primary conductor of the transformer over 360°. The winding of each partial circuit is constituted by a go winding and by a return winding which occupy the angular extent of the partial circuit. The complete circuit is equivalent to a Rogowski type secondary circuit of the transformer. A voltage signal measured on this secondary circuit is thus proportional to the derivative of the current conveyed by the primary conductor.

STATE OF THE PRIOR ART

It is recalled that a Rogowski coil, also referred to as a Rogowski torus, is conventionally in the form of a conductor wound on a former of toroidal shape and made of a material that is not ferromagnetic, thereby giving it excellent characteristics of linearity due to its lack of saturation. One of the difficulties in measuring a primary current by means of a secondary circuit or conductor in the form of a Rogowski coil results from temperature variation in the parameters of the coil, which can lead to large measurement errors. Furthermore, if the coil is not accurately axially symmetrical, measurement of the derivative of the primary current depends on the position of the primary conductor passing through the torus, and also on its orientation. It is known that good axial symmetry requires the conductor winding to be made up at least of two windings, i.e. a winding wound on a go path followed by an analogous winding wound on the opposite return path and having turns wound in the same direction on both the go and the return paths in order to cause flux to be additive for the go and return windings. Such a dual go-and-return winding enables the coil to be unaffected by the electromagnetic fields produced by strong currents conveyed by electrical conductors situated outside the torus.

Current transformers are known in the state of the art that use partial circuits comprising Rogowski type windings. Patent document DE 4 424 368 discloses a complete coil of square shape, presenting axial symmetry relative to the primary conductor which passes through its center. That coil is made up of four portions each constituted by a tube covered in a first layer of conductive material, the layer being etched helically to form a track forming a go winding. The conductive material is covered in an insulating layer and a second layer of conductive material which is likewise helically etched to form a return winding. The four go tracks are connected in series with one another by connection elements interconnecting the tubes, and so are the four return tracks. The complete go track is connected in series with the complete return track, and the complete go-and-return coil made in this way is interrupted at a given location on one of the tubes in order to implement two outlet terminations across the terminals of which it is possible to measure the voltage induced in the coil by the primary current.

That principle of building up a complete Rogowski coil from partial coils in the form of angular portions is also applied in the embodiments disclosed in patent application DE 10 161 370 or U.S. 2003 137 388 A1. In particular, an embodiment is described in which the complete coil is made up by associating eight semi-annular circuit portions in series. Each portion is constituted by a printed circuit board (pcb) forming a half-ring, and a stack of four plates is made to form half of the coil which comprises halves of the go-and-return windings. The two stacks in half-rings are separable at two adjacent angular ends in order to facilitate installing the complete coil around the primary conductor of the transformer. The series connection of the go winding with the return winding is located at a first one of said two adjacent angular ends. The two output terminations of the complete coil are situated at the second angular end which is adjacent to the first. There is thus no electrical connection between these two adjacent angular ends, while nevertheless achieving a dual go-and-return winding over 360° so as to enable the complete coil to present a degree of axial symmetry.

It is known that the voltage $v_s$ measured by acquiring (and generally also amplifying) the electromotive force (emf) signal $v_e$ across the terminals of a Rogowski coil surrounding a primary conductor over 360° depends on the time derivative of the algebraic measurement of the primary current $i_p$ in accordance with the following relationship:

$$v_s(t) = D \cdot S(T) \cdot \frac{\partial i_p}{\partial t} \qquad (1)$$

in which S(T) designates the sensitivity of the coil to temperature T during measurement, the constant D designating an amplification factor specific to the system for acquiring the emf $v_e$. The signal $v_s$ is thus indirectly an image of the primary current. Below, $S_0$ designates the sensitivity of the coil at a given reference temperature $T_0$. In addition, if a Rogowski type coil is wound on a tube in the form of a circular arc, also referred to as a "former", extending over an angular sector having a certain angle θ, it is possible to define the sensitivity $s_0$ of this portion of the winding at the temperature $T_0$ as being equal to $S_0 \times θ/360$, where θ is expressed in degrees, $S_0$ being the sensitivity of the complete Rogowski coil extrapolated by extending the winding uniformly over 360° around a circular former. For example, if a complete coil is constituted by connecting in series two semi-annular winding portions as shown in patent application DE 10 161 370, it is possible to define the sensitivity $s_0$ of each winding portion as being equal to half the sensitivity $S_0$ of the complete coil.

Nevertheless, it should be observed that with a Rogowski type winding defined over an angular sector of less than 360°, the measurement of current in a primary conductor is influenced by the position of the conductor relative to the winding, and is a fortiori strongly influenced if said angular sector is less than 180°. By way of example, we take a semi-annular winding disposed perpendicularly to a rectilinear primary conductor so that the conductor is at equal distances from both ends of the winding. Any displacement, even if very small, tending to move the winding away from the primary conductor then leads to a significant decrease in the emf measured across the terminals of the winding, assuming that the primary current is uniform over time. The magnetic field generated by the primary current at a given point decreases with increasing distance between said point and the primary conductor. Consequently, the flux induced in the winding decreases due to the above-mentioned displacement, and the measured image of the primary current is thus attenuated.

For these reasons, and in order to be able to obtain a reliable measurement of a current by means of a Rogowski type winding, it is essential firstly for the winding to make a complete turn around the primary conductor so as to be capable of presenting accurate axial symmetry. In order words, looping the secondary circuit of the transformer over 360° is one of the conditions that are necessary in order to be able to make measurements independently of the position of the primary conductor relative to the secondary. That is why the notion of the sensitivity of a Rogowski type winding generally appears in the literature relating to this technical field only for a winding that forms a torus, or for a set of windings connected in series in order to make up a complete turn. In known current transformer devices using windings made up of portions of a complete Rogowski coil, such as the transformer shown in patent application DE 10 161 370, for example, each winding is always connected electrically in series with at least one analogous winding formed by another coil portion so that together these portions make up a complete Rogowski coil surrounding a primary conductor over 360°.

In an embodiment having two semi-annular windings connected in series, the sensitivity of the complete annular winding is practically equal to that of a single winding having the same dimensions. Furthermore, providing the series connection is sufficiently short to disturb the uniformity of the windings in the junction zone between the two windings as little as possible so as to conserve almost perfect axial symmetry, measurement can remain almost independent of the position of the primary conductor. The relative extra cost implied by such an embodiment based on separable windings compared with a conventional winding on a closed support can be justified in particular by the ease with which the complete winding can be installed around the primary conductor. There also exists a particular context in which it can be advantageous to build up a complete Rogowski coil from partial coils, and without necessarily allowing two partial coils to be separated in order to pass the primary conductor into the loop formed by the complete coil.

As is known from patent document EP 0 573 350, it is advantageous to make a Rogowski coil from a pcb that is substantially square and that is provided with a circular cutout for passing the primary conductor. That type of coil presents perfect axial symmetry, and makes it possible to obtain a go winding and a return winding with a large number of turns with flux of the go and the return windings being additive, thereby obtaining very good sensitivity for the coil, together with very good measurement accuracy of the order of 0.1%. Accuracy also remains stable over time since it is practically insensitive specifically to vibration and to temperature variations that might affect the coil. It is possible to take a measurement that is practically independent of temperature by using a resistor in parallel with the output terminals of the coil, and having resistance that is selected as a function of various parameters of the coil, as taught in patent document EP 0 587 491.

Machines for making pcbs enable boards to be produced in a certain range of sizes. At the date on which the present patent application was filed, it would appear that no machine exists that is capable of obtaining pcbs of dimensions greater than 700 millimeters (mm). Even if such machines should be developed in the future, the cost of manufacturing a pcb of large dimensions will, a priori, remain greater than the cost of a plurality of pcbs assembled together to form a pcb of large size. Certain current measurements made using a Rogowski coil, e.g. on gas-insulated metal-clad electrical gear or lines, require the ring that is formed by the tracks and the printed-through holes of the secondary coil of the transformer to have an inside diameter that is at least of the same order as this value of 700 mm. It should be observed for such diameters, it is very advantageous to make coils out of pcbs in order to be able to conserve measurement accuracy in the 0.1% class, since conventional techniques for making a coil by winding a conductor do not enable coils to be produced that reach this accuracy class.

One technical solution for enabling coils of larger size to be made out of pcbs consists in assembling together a plurality of pcbs in a common plane, each pcb having angular coil portions etched thereon. A first method of interconnecting the angular portions of a complete coil consists in connecting them together electrically in series via conductors specially adapted for this purpose, i.e. in connecting the windings together in series in the same go or return direction at each junction between two adjacent plates, on the same principle as for the connections are made between the etched tubes shown in patent document DE 4 424 368. For example, it is possible to assemble together four quarters of a complete annular coil, each quarter being made from a square pcb of side having length equal to at least half the outside diameter of the annular coil. It is thus possible to make up complete coils using pcb technology up to an outside diameter of about 1400 mm, thereby exceeding the greatest dimensions of the metal cladding around which current transformer secondaries are installed with present-day metal-clad electrical gear or lines.

The secondary circuit of the current transformer implemented by the complete annular coil can thus be installed at atmospheric pressure, e.g. around a double metal shell providing a leaktight connection between two metal cases filled with insulating gas under pressure and having the primary conductor of the transformer passing therethrough. By way of example, the primary conductor is constituted by the conductor of a single-phase metal-clad line. The two shells are connected together by means of a gasket providing sealing relative to the insulating gas, the gasket being made of a material that provides electrical insulation. This enables the return current flowing in the metal cases to pass outside the annular coil, and thus ensures that current measurement is not influenced by the return current.

Nevertheless, the technique consisting in electrically connecting the angular portions of a complete coil together in series can present certain drawbacks, both for a coil in the form of a conventional toroidal winding and for an annular coil made using printed circuit technology. Firstly, a connection via a conductive bridge interconnecting two adjacent portions of the complete coil disturbs the uniformity of the distribution of turns in the junction zone between the windings, to some extent. This can be seen in particular, for example, in FIG. 3, of patent document DE 10 161 370. For angular portions implemented in the form of pcb quarters, it is necessary to provide connections that are very short in order to conserve almost perfect uniformity of turn distribution in the complete Rogowski coil, in order to maintain measurement accuracy within the 0.1% class. Furthermore, the electrical and mechanical junction zone between two adjacent pcb quarters constitutes a zone of weakness given the vibrations and the expansions to which such quarters are subject. Even by providing for the quarters to be mounted on elements that are relatively flexible, such as elements made of rubber, in order to limit the amplitude of vibrations and the stresses at the joins between the quarters, it is possible to avoid the risk of breaks in the conductive bridges which interconnect the printed circuits of the quarters if the bridges are themselves provided in rigid form, so it is therefore generally necessary to provide conductive bridges that are flexible.

The difficulties in obtaining an electrical junction between two adjacent pcb quarters that is mechanically reliable and that disturbs measurement as little as possible can nevertheless be overcome, in particular when using the technique of a conductive bridge that is flexible. It is thus possible to obtain a complete annular Rogowski coil of large size made up of pcb quarters, and that is electrically equivalent to a coil of the same size and made using a single pcb as taught in patent document EP 0 573 350, naturally assuming that a machine were available enabling a pcb of such size to be made. The two electrical terminations of the complete Rogowski coil are preferably situated at one end of a quarter of the coil beside the junction with the adjacent quarter, said junction then being the only junction which is not crossed by a conductive bridge.

When considering the above technique using Rogowski coil quarters, in particular for pcb technology embodiments as taught by patent document EP 0 573 350, account needs to be taken of the fact that the ring formed by the complete coil of the current transformer may have a diameter that is typically greater than 700 mm in applications to current transformers for gas-insulated metal-clad electrical gear. The total number of turns (each formed by two opposite track segments and by two plated-through holes in a pcb) can then be very large for the complete Rogowski coil. At this stage, it should be recalled that the total sensitivity $S_0$ of a Rogowski coil of large diameter differs little from that of a coil of smaller diameter but having the same density of turns. The increase in sensitivity due to the greater number of turns is counterbalanced by the smaller magnitude of the magnetic field due to the coil being further away from the primary conductor whose current is to be measured.

Thus, even for a coil of large diameter, the parasitic surge voltage signals that might interfere with the emf signal induced in the coil are of relatively large amplitude because the total sensitivity $S_0$ is practically independent of the diameter of the coil. The interfering signals are caused by high frequency currents in the line whose primary current $i_p$ is being measured by the transformer. Because the emf signal is proportional to the derivative of the primary current $i_p$, any disturbances at high frequency that affect the primary current will inevitably lead to voltage surges at the terminals of the secondary winding of the transformer. The interfering voltage surge signals must then be processed by an acquisition and processor unit suitable for producing a corrected signal $v_s$ (which signal is usually amplified) that is an image of the corrected primary current signal from which the high frequency current disturbances have been filtered.

Because of their relatively large amplitudes, interfering voltage surge signals can be difficult to process when correcting the measured signal, which then leads to measurement of smaller accuracy. Even when high-performance signal correction processing is applied to the emf signal across the terminals of the Rogowski coil in order to obtain very high measurement accuracy, that generally involves cost that is increased compared with obtaining accurately of the same order in a situation where the voltage surge interference signals are of smaller amplitude.

The main object of the invention is to provide a current transformer whose secondary circuit comprises a complete Rogowski coil of large diameter made up from a plurality of angular coil portions that are mechanically assembled together with very good uniformity in terms of axial symmetry for the complete coil, while also having a configuration for the transformer secondary circuit that serves to limit the amplitudes of the interfering voltage surge signals to be processed. A more particular object of the invention is to provide pcb technology embodiments of complete Rogowski coils of large diameter while omitting any conductive bridge between the coils of adjacent partial pcbs making up the complete coil, which embodiments should enable accuracy to be achieved at least of class 0.1% with excellent temperature stability.

SUMMARY OF THE INVENTION

To this end, the invention provides a current transformer comprising at least two partial circuits each comprising a Rogowski type winding, each of said partial circuits being made in the form of an angular portion of a complete circuit which surrounds at least one primary conductor of the transformer over 360°, said complete circuit having the function of a Rogowski type secondary circuit for the transformer, the winding of each partial circuit being constituted by a go winding together with a return winding extending over the angular extent of the partial circuit, characterized in that for each partial circuit, said go and return windings are electrically connected in series, both having turns wound in the same direction so as to form a single winding presenting a pair of adjacent electrical terminations, the pairs of electrical terminations of said windings being connected to an acquisition system designed to produce a complete signal which is an image of the primary current of the transformer.

The complete circuit constituted by associating a number N of partial circuits thus presents the same number N of pairs of electrical terminations. As explained below, the emf signals $v_{s(n)}$ measured across the terminals of each partial circuit are transmitted to a summing acquisition system (generally including amplification) designed to recreate a complete signal $v_s$ which, at a given reference temperature $T_0$, satisfies the following relationship:

$$v_s(t) = K \cdot \sum_{n=1}^{N} v_{s(n)}(t) = K \cdot S_0 \cdot \frac{\partial i_p}{\partial t} \quad (2)$$

where K designates the overall amplification factor of the summing acquisition system, and $S_0$ designates the sensitivity of the equivalent complete circuit. It is explained below how the resistances of the resistors that define the overall amplification factor can be parameterized so that the factor is insensitive to variations in temperature. It should be observed that $S_0$ is equal to the sensitivity of a complete coil as would be constituted by connecting the windings of the partial circuits in series in order to obtain a configuration equivalent to that described in patent EP 0 573 350, in which configuration the complete coil presents only two electrical terminations for acquiring the emf signal constituting an image of the primary current.

In a current transformer of the invention, and when all of the partial circuits are identical, the sensitivity $S_0$ of the complete equivalent circuit is equal to the sensitivity $s_0$ of a partial circuit multiplied by the number N of partial circuits. Above equation (2) can then be written:

$$v_s(t) = K \cdot N \cdot s_0 \cdot \frac{\partial i_p}{\partial t} \quad \text{i.e.} \quad (3)$$

$$\frac{\partial i_p}{\partial t} = \frac{v_s(t)}{K \cdot N \cdot s_0}$$

and it is therefore possible to determine the primary current of the transformer by integrating over time the complete signal $v_s$ as measured on the Rogowski type secondary circuit.

Preferably, the pair of electrical terminations of a partial circuit is placed at one of the two angular ends of the partial circuit, the go and return windings each traveling over the angular extent of the partial circuit and being electrically connected together in series at the other angular end. This disposition of the terminals at one angular end of a partial circuit makes it possible in particular for the terminals of two adjacent partial circuits to be placed side by side so as to use two relatively short shielded cables of the same length for connecting both circuits to a signal acquisition system. It has been found that it is important for the cables to be both relatively short and of the same length in order to minimize the interfering signals that might be generated in the cabling by the strong electromagnetic field due to the current being conveyed in primary conductors adjacent to the current transformer, and keep them down to levels that do not prevent accuracy being in the 0.1% class.

In a preferred embodiment of a current transformer of the invention, each partial circuit is embodied by a plane or curved pcb having a series of metal tracks on each of its two faces, the tracks in one series being electrically connected to those of the other series via plated-through holes passing through the pcb in order to form the winding of the partial circuit.

In another advantageous embodiment of the current transformer of the invention, one of the two terminations of the winding of each partial circuit is electrically connected to a common reference potential, while the other termination is electrically connected to an input of an acquisition system which provides an amplification function including at least one operational amplifier with a feedback loop. Advantageously, each input of the acquisition system is connected to an operational amplifier input via a resistor of resistance selected so that the voltage signal measured at the output from the acquisition system is independent of variations in the temperature of the secondary circuit of the transformer.

BRIEF DESCRIPTION OF THE DRAWINGS

The invention, its characteristics, and its advantages are described in greater detail below with reference to the following figures.

DETAILED DESCRIPTION OF PARTICULAR EMBODIMENTS

Figure 1:
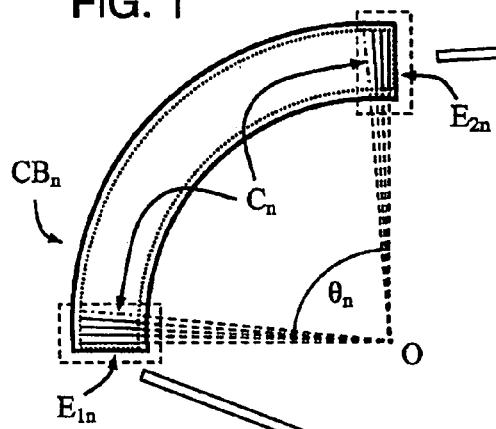
FIG. 1 is a diagram of a partial circuit of a current transformer of the invention in the form of a plane annular quarter made using pcb technology.

In FIG. 1, a partial circuit $CB_n$ for a current transformer of the invention is shown diagrammatically in the form of a plane annular quarter made using pcb technology. The method of making the turns of a pcb Rogowski winding is known from patent document EP 0 573 350, which allows the rectilinear metal tracks that are provided on the two faces of the printed circuit to be disposed on radii which, when extended, pass through the center O of the annular quarter. The angular extent $\theta_n$ of the partial circuit is equal to 90° in this case, such that a complete circuit is formed by associating four identical partial circuits with one another in a common plane in order to constitute the secondary conductor of a Rogowski type transformer. Below, the term "secondary circuit" is used to designate a secondary conductor of a current transformer of the invention, in particular when made using pcb technology. With present-day machines for manufacturing pcbs, it is possible to make a partial circuit occupying an annular quarter up to an outside radius of about 500 mm, using a rectangular pcb that is about 700 mm long in its greatest dimension.

A partial circuit $CB_n$ is thus formed in the present case by a quarter of an annular secondary circuit as described in patent EP 0 573 350. Nevertheless, it is not electrically identical to a quarter as would be obtained merely by cutting up a printed circuit constituting a Rogowski coil in the above-specified state of the art. As can be seen in FIG. 1b, each partial circuit $CB_n$ has, at a first annular end $E_{1n}$, a pair of adjacent electrical terminations $T_{1n}$ and $T_{2n}$ which constitute the two ends of a single continuous winding $C_n$. The go and return windings respectively $C_{n0}$ to $C_{n1}$ that cover the angular extent of the partial circuit are electrically connected in series at the second angular end $E_{2n}$ of the circuit so that the coil $C_n$ is continuous between the two terminals constituted by the terminations $T_{1n}$ and $T_{2n}$. The metal tracks shown in continuous lines are formed on one face of the partial circuit, while the tracks shown in dashed lines are formed on the other face of the circuit.

Figure 1A:
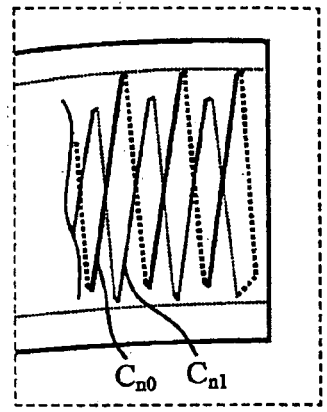
FIG. 1a is a diagram showing a first angular end of the partial circuit of FIG. 1, and on a larger scale.
Figure 1B:
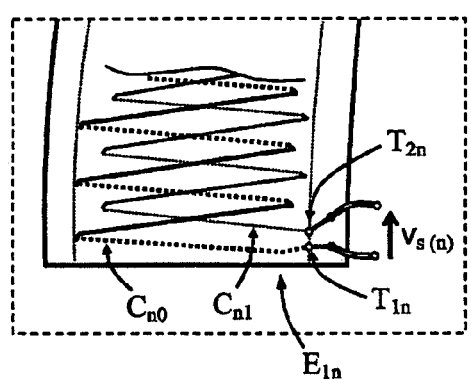
FIG. 1b is a diagram showing a second angular end of the partial circuit of FIG. 1, and on a larger scale.

As can be seen in FIGS. 1a and 1b, the two angular ends $E_{1n}$ and $E_{2n}$ of a partial circuit $CB_n$ for a current transformer of the invention do not include any conductive bridge for connection to another partial circuit, since the winding $C_n$ of a partial circuit $CB_n$ is independent from the windings of the other partial circuits of the circuit that is complete over 360°. As shown in FIG. 1b, an emf signal $v_{s(n)}$ can be measured across the terminals constituted by the two terminations $T_{1n}$ and $T_{2n}$ of each partial circuit.

In order to simplify the diagrams of FIGS. 1a and 1b, the go and return windings respectively $C_{n0}$ and $C_{n1}$ are shown as though the continuous winding $C_n$ was formed by a conductor wire wound around a ring. Nevertheless, that method of winding is not, in fact, adapted to a partial circuit for a current transformer of the invention, even though it satisfies the need to avoid having wires crossing over between the go and return windings. As can be seen in FIG. 1a, the go winding $C_{n0}$ does not have its turns wound in the same direction as the return winding $C_{n1}$. More precisely, while the turns of the go winding $C_{n0}$ advance in the direction that is counterclockwise for an observer turned towards the right of FIG. 1a, the turns of the return winding $C_{n1}$ progress in the clockwise direction for the same observer. That method of winding therefore cannot enable flux to be additive between the go and return windings, and another method must be used in order to make the particular winding of a partial circuit that is for use in a current transformer of the invention. For example, when using pcb technology, it is possible to adopt the winding method with interleaved go and return turns that is described in patent document EP 0 573 350, with reference to the configuration of metal tracks shown in FIG. 2b of that document.

Figure 2A:
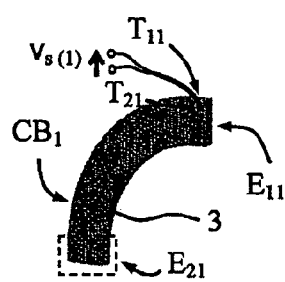
FIG. 2a is a diagram of the partial circuit forming one of the quarters making up the complete circuit of FIG. 2.
Figure 2:
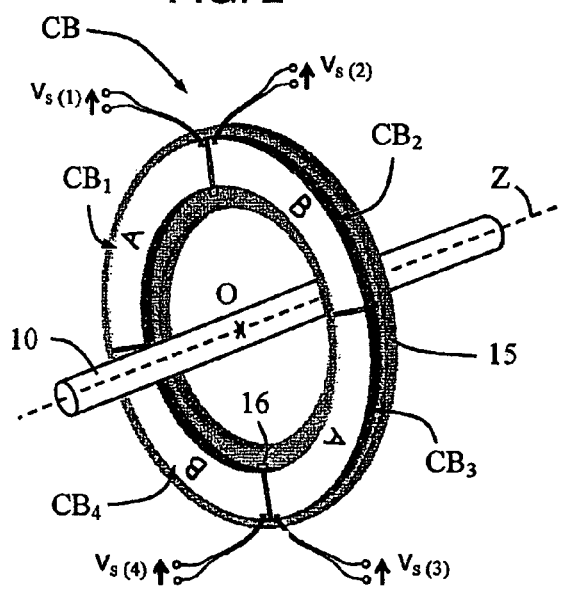
FIG. 2 is a diagrammatic perspective view of a current transformer of the invention comprising a complete ring circuit made up by associating four partial circuits forming identical quarters with alternating faces and making up the secondary circuit of the transformer.

FIG. 2 is a diagrammatic perspective view showing a complete ring circuit CB made up of by associating four partial circuits, themselves made using pcb technology. The complete circuit constitutes the secondary circuit of a current transformer of the invention, the primary conductor of the transformer being constituted in this case by a bar 10 of axis Z passing through the ring, preferably perpendicularly and at its center O. The four partial circuits constitute identical quarters having alternating faces A and B which are mounted on a common plane annular frame 15 so that the adjacent angular ends of the partial circuits are held next to one another. Fasteners 16 having resilient return properties are provided to hold together two adjacent angular ends. The coefficient of expansion of the frame 15 is preferably substantially equal to the coefficient of expansion of the substrate of the pcbs, so as to avoid any slack or excessive stress appearing between two adjacent partial circuits during a change of temperature.

Four identical partial circuits $CB_1$ to $CB_4$ are thus assembled on the annular frame 15, the complete circuit being held on the frame, e.g. by means of circular holes formed through radial projections from the outside edges of the printed circuits. These holes must then be provided so as to pass corresponding cylindrical studs with little clearance, which studs are fixed on the frame, with it being possible for two cylindrical studs to suffice for mounting one partial circuit on the frame. In this embodiment of a complete ring circuit made up of identical partial circuits, two adjacent partial circuits, when seen from the same side of the ring, have alternating A faces and B faces so that their respective two pairs of terminals are disposed side by side. The advantage of this disposition is explained below with reference to the embodiment shown in FIG. 8.

The partial circuit $CB_1$ of the complete circuit CB shown in FIG. 2 is shown diagrammatically in FIG. 2a. The two terminals $T_{11}$ and $T_{21}$ of the printed circuit are located in this case on the face A of the single layer 3 of the substrate forming the pcb, at the first angular end $E_{11}$ of the annular quarter. These two terminals are spaced apart by a distance that is typically a few tenths of a millimeter, so as to enable them to be connected respectively, e.g. by soldering, to two cables which terminate at an acquisition system for measuring the emf $v_{s(1)}$ of the circuit $CB_1$. Preferably, these two terminals are constituted by plated-through holes passing through the thickness of the plate 3 and which constitute the terminations $T_{11}$ and $T_{21}$ of the winding of the partial circuit $CB_1$. In this way, the soldering for the two above-mentioned cables can be done from either of the two faces A and B of the circuit. In particular, the partial circuit $CB_2$ visible in FIG. 2 is designed to be identical to the circuit $CB_1$, but the soldering of the two cables for measuring the emf $v_{s(2)}$ of the circuit is done on its face B. In this way, the pairs of cables from the partial circuits can be all situated on the same side of the complete circuit CB, e.g. on the side that is visible in FIG. 2.

Figure 2B:
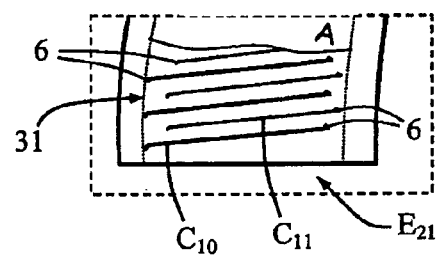
FIG. 2b is a diagram showing one face of one angular end of the partial circuit, of FIG. 2a, showing the series of metal tracks on said face.
Figure 2C:
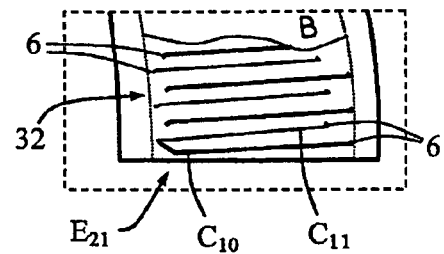
FIG. 2c is a diagram showing the other face of the angular end of the partial circuit shown in FIG. 2b, together with its series of metal tracks.

In FIG. 2b, the face A of the second angular end $E_{21}$ of the partial circuit $CB_1$ of FIG. 2a is shown diagrammatically, showing the series 31 of metal tracks on this face. The tracks of the go winding $C_{10}$ and the tracks of the return winding $C_{11}$ are interleaved and almost mutually parallel, thus making it possible for track density to be high so as to impart high sensitivity to the winding of the partial circuit. The face B of this second angular end $E_{21}$, with its series 32 of metal tracks, is shown diagrammatically in FIG. 2c. Plated-through holes 6 pass through the substrate of the circuit at the ends of the tracks, serving to interconnect the tracks of a given go winding $C_{10}$ or return winding $C_{11}$ in order to make the turns of the Rogowski winding as described in patent document EP 0 573 350.

Figure 3:
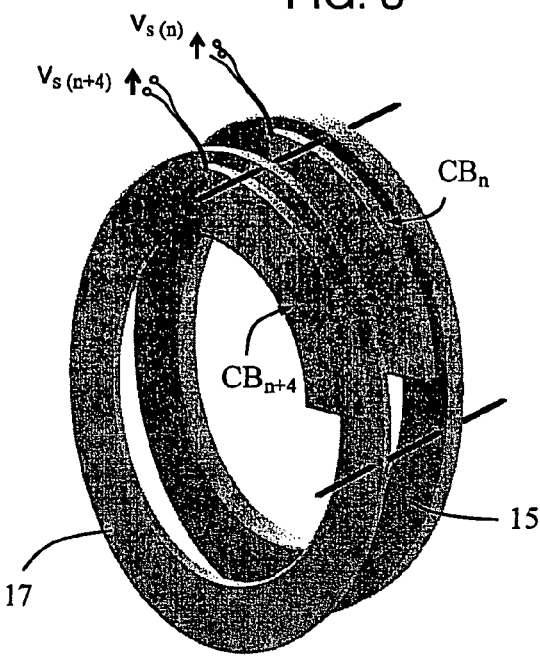
FIG. 3 is a diagrammatic fragmentary view of a secondary circuit of a current transformer of the invention, comprising two complete circuits placed mutually in parallel.

FIG. 3 is an exploded diagrammatic fragmentary view of a secondary circuit comprising two complete circuits placed mutually in parallel. For reasons of simplification, only the partial circuits $C_{Bn}$ and $CB_{n+4}$ are shown. On the same principle as that described in patent document EP 0 573 350, and with reference to FIG. 3 of that document, it is advantageous to superpose a plurality of Rogowski coils in order to multiply the sensitivity of the total secondary circuits correspondingly. In this case, each complete coil is mounted so as to be held in place by rods fixed to the annular frame 15. An annular metal shield 17 is interposed between the two coils and serves as a support for ensuring that the partial circuit $CB_{n+4}$ is plane. This shield acts in capacitive manner relative to the main support formed by the annular frame 15, which in this case is likewise made of metal. The two superposed metal frames 15 and 17 are held in axial alignment by rods secured to the frame 15. It is thus possible to build up a stack of alternating layers of Rogowski coils made of pcbs and of metal shields 17. Advantageously, a mylar sheet can be interposed between each face of a shield 17 and the printed circuits of the complete coil which is held pressed against the face.

Figure 4:
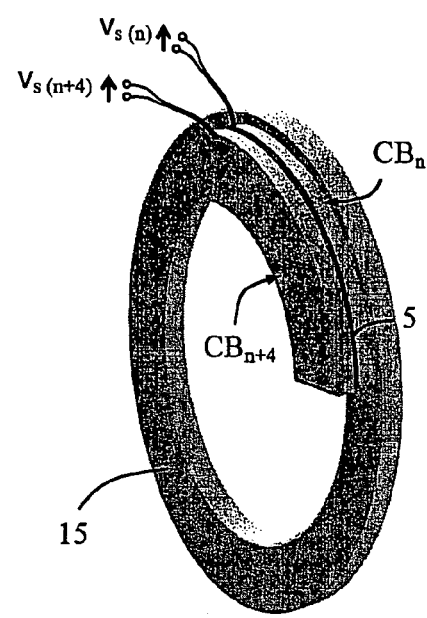
FIG. 4 is a diagrammatic fragmentary view of another secondary circuit of a current transformer of the invention.

FIG. 4 is a diagrammatic fragmentary view of another secondary circuit comprising two complete circuits disposed mutually in parallel. With the exception of the capacitive screens which have been removed in this case, this secondary circuit is electrically equivalent to that of FIG. 3. A layer 5 of resin or of some other insulating material is interposed between each partial circuit $CB_n$ and the partial circuit $CB_{n+4}$ which is superposed thereon, enabling each group of superposed partial circuits to form a stack of two pcbs. The material of the insulating layer 5 which separates the two pcbs must have a coefficient of expansion that is close to or equal to that of the substrate of the pcbs, and it may optionally also have the function of fitting the pcbs together. Only one group is shown in the figure, but it should be understood that the secondary circuit is made up of four groups of superposed partial circuits mounted on the same annular frame 15.

Figure 5:
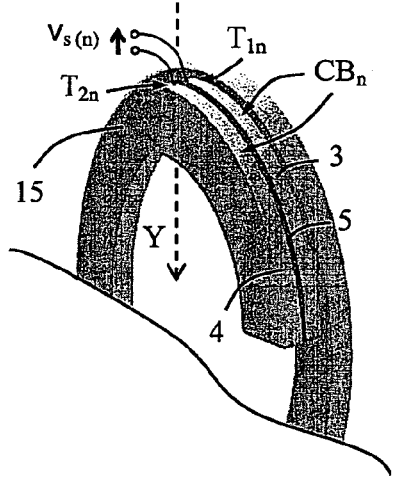
FIG. 5 is a diagrammatic fragmentary view of another secondary circuit of a current transformer of the invention, made up of a single complete circuit in which each partial circuit comprises two superposed pcbs.

FIG. 5 is a diagrammatic fragmentary view of another secondary circuit of a current transformer of the invention, constituted in this case by a single complete coil. Each partial circuit of the complete coil comprises two superposed printed circuit quarters that are separated by a layer of insulating material 5. In this case, each pcb 3 or 4 forming a quarter is etched in such a manner that the winding formed by the pcb is constituted by a single go or return winding. For example, if the go winding is etched on the pcb 3 starting from the terminal constituted by the termination $T_{1n}$ at one angular end of the quarter, an electrical connection is then made at the opposite angular end to connect with the return winding which is etched on the plate 4. The tracks of the return winding must be disposed so that the winding direction of the turns is the same as for the go winding, so that the respective fluxes of go and return windings add. The terminal $T_{2n}$ of the return winding may be situated very close to the terminal $T_{1n}$, being separated therefrom by the thickness of the insulating layer 5. This thickness is preferably limited to a few tenths of a millimeter.

Figure 5A:
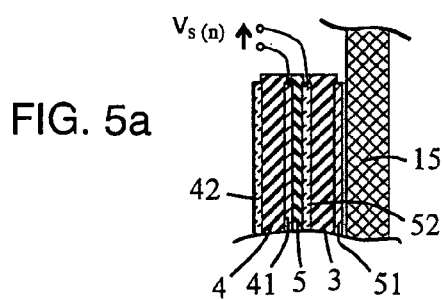
FIG. 5a is a diagrammatic plan view of the partial circuit shown in FIG. 5, together with its support.

FIG. 5a is a diagrammatic plan view of this partial circuit seen looking along direction Y represented by a dashed-line arrow. In known manner, the two series 41 and 42 respectively of tracks etched on the two faces of the plate 4 are interconnected by plated-through holes passing through the thickness of the pcb. The same applies for the two series 51 and 52 respectively of tracks etched on the two faces of the plate 3. The thickness of the insulating layer 5 is preferably smaller than the thickness of either pcb 3 or 4.

Figure 6:
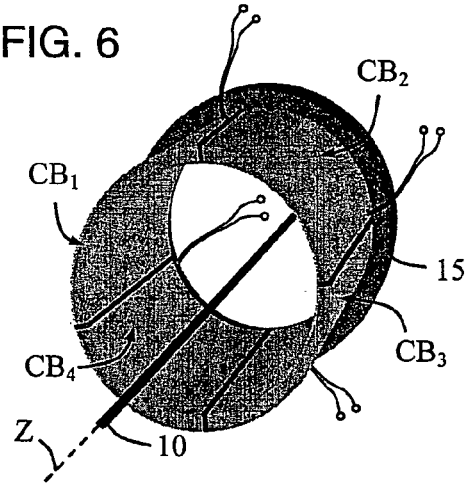
FIG. 6 is a diagrammatic perspective view of a current transformer of the invention comprising a complete tubular ring circuit made up by associating four partial circuits forming identical quarters.
Figure 6A:
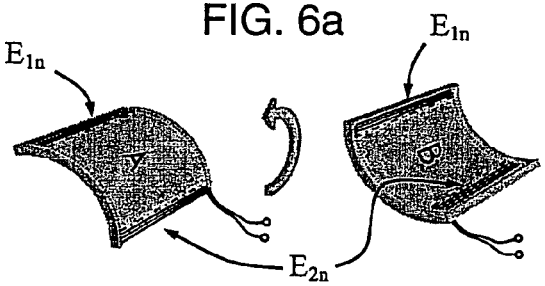
FIG. 6a is a diagram of the two faces of a partial circuit forming one of the quarters constituting the complete circuit of FIG. 6.

FIG. 6 is a perspective view of another current transformer of the invention that is of a particular configuration. The secondary of the transformer is formed by a complete tubular ring circuit made up by associating four partial circuits forming identical quarters, this complete circuit being fixed to an annular frame 15. Each pcb is thus curved so as to have the shape of an angular portion of a tubular ring whose axis of symmetry coincides substantially with the axis Z of the primary conductor 10 of the transformer. As can be seen in FIG. 6a, the metal tracks of each of the faces A and B of a partial circuit are parallel to said axis of symmetry. Each angular end $E_{1n}$ or $E_{2n}$ of a partial circuit lies along a rectilinear edge of the curved pcb forming the circuit.

Figure 7:
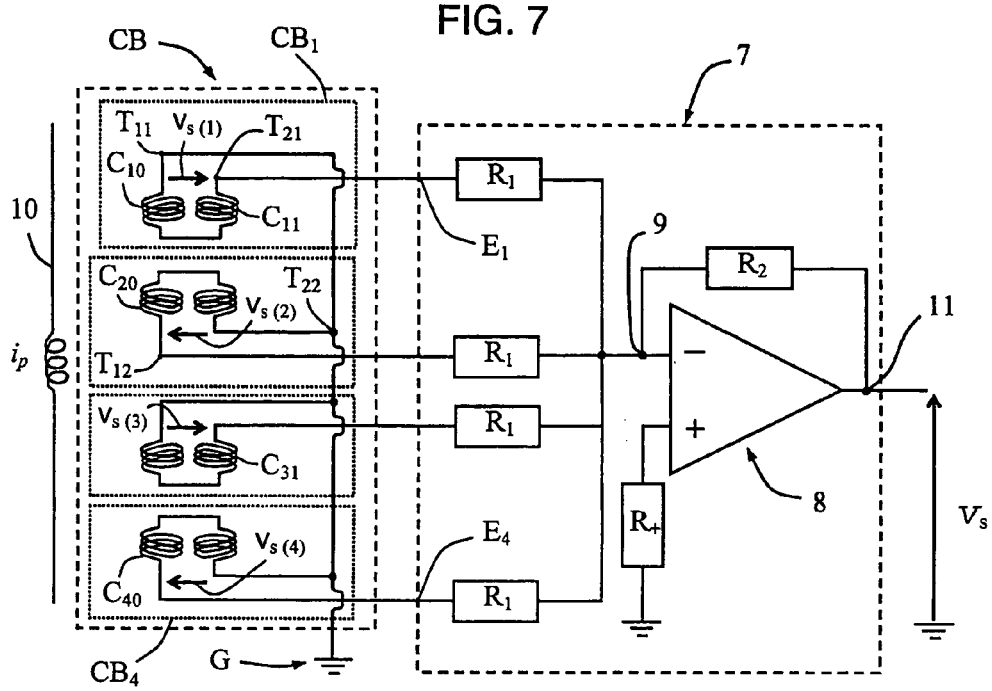
FIG. 7 is the electrical circuit diagram of a current transformer of the invention comprising a complete circuit made up by associating four alternating identical partial circuits, and further comprising a summing acquisition system.

The electrical circuit diagram of a current transformer of the invention is shown in FIG. 7. By way of example, the transformer corresponds to that shown in FIG. 2, and it comprises a complete secondary circuit CB made up by associating four identical partial circuits with alternating faces. The secondary circuit of the transformer is electrically connected to an acquisition system 7 which in this case serves both to sum and to amplify, and for this purpose comprises an operational amplifier 8 together with a feedback loop. For each partial circuit $CB_n$, one of the two terminals $T_{1n}$ or $T_{2n}$ of the winding is connected to a common reference potential G, while the other terminal is electrically connected to an input En of the acquisition system 7.

For example, the terminal $T_{11}$ of the partial circuit $CB_1$ connected to earth at ground potential, and the other terminal $T_{12}$ is connected to a resistor $R_1$ at the input of the acquisition system 7. As shown diagrammatically in the figure, the winding of each partial circuit $CB_n$ must have its turns wound in the same direction on both the go and the return paths respectively in order to have additive flux between the go and return windings $C_{n0}$ and $C_{n1}$. For example, it can be seen that on going from the terminal $T_{11}$ to the terminal $T_{12}$, the go winding $C_{10}$ and the return winding $C_{11}$ have their turns wound in the same direction, which is counterclockwise.

Advantageously, the two terminals $T_{1n}$ and $T_{2n}$ of a partial circuit are connected respectively to ground and to one of the inputs $E_1$ to $E_4$ of the acquisition system 7 in a manner that alternates relative to the two terminals $T_{1n+1}$ and $T_{2n+1}$ of an adjacent partial circuit. In this way, the output voltage signals $v_{s(1)}$ to $v_{s(4)}$ of the partial circuits are summed in phase by the acquisition system. It is important to avoid these signals being summed in phase opposition, since the voltage signal $v_s$ measured at the output terminal 11 of the acquisition system would then be substantially zero. Because the partial circuits are assembled together as shown in FIG. 2 with their faces alternating in pairs, it is necessary in this configuration to alternate the polarities of the connections between the terminals of the partial circuits and the inputs of the acquisition system. The in-phase sum of the voltage signals is thus applied to the inverting input 9 of the operational amplifier 8.

The principle of summing and amplifying as shown by the circuit of FIG. 7 can also be applied when the current transformer has a plurality p of complete circuits disposed mutually in parallel. Such a disposition of complete circuits is described above with reference to FIGS. 3 and 4. The input 9 of the operational amplifier 8 is connected via a resistor $R_1$ to one of the terminals of each of the partial circuits $CB_n$ making up the p complete circuits. If each complete circuit comprises four partial circuits, there will be 4p input resistors $R_1$ to the acquisition system 7.

As shown below, the signal $v_s$ as measured at the output from the acquisition system 7 is independent of temperature variations providing the resistance of each input resistor $R_1$ of the acquisition system 7 satisfies relationship (9) below.

It is shown above that the sensitivity s of a partial circuit is defined such that the emf signal $v_s$ measured across the terminals of a partial circuit satisfies the relationship:

$$v_s = s \cdot \frac{\partial i_p}{\partial t} \tag{4}$$

Furthermore, the internal resistance r of the winding of a partial circuit varies linearly with the temperature T of the partial circuit in application of the following relationship which is well known in itself:

$$r = r_0(1 + \beta \cdot \delta T) \tag{5}$$

where $\delta T = T - T_0$, where $\beta$ is the temperature coefficient for the resistivity of the material constituting the winding, and where $T_0$ is the reference temperature. For example, if the material is copper, then $\beta$ is about 3900 parts per million per degree Celsius (ppm/° C.).

Similarly, the sensitivity s of a partial circuit varies linearly with the temperature T of the substrate since an expansion of the substrate increases the section of the turns of the partial circuit, with said section being proportional to the thickness of the substrate. This relationship is written as follows:

$$s = s_0(1 + \alpha_z \delta T) \tag{6}$$

where $\alpha_z$ is the coefficient of linear expansion of the substrate in the direction perpendicular to the surface of the substrate. In the embodiment shown in FIG. 2, this direction corresponds to the axis Z. The coefficient $\alpha_z$ typically lies in the range 40 ppm/° C. to 60 ppm/° C., depending on the materials used.

The current at the inverting input 9 of the operational amplifier 8 is zero assuming that the amplifier is ideal, so Kirchoff's law leads to the following relationship:

$$\sum_{n=1}^{N}\left[\frac{v_{s(n)}}{r_{(n)}+R_1}\right]+\frac{v_s}{R_2}=0$$

where N is the number of partial circuits. Given relationship (4), the following is obtained:

$$v_s = -R_2 \cdot \sum_{n=1}^{N}\left[\frac{s_{(n)} \cdot \frac{\partial i_p}{\partial t}}{r_{(n)}+R_1}\right] \quad (7)$$

Since the N partial circuits are assumed to be identical and at the same temperature T, it can be assumed that the windings all have the same internal resistance r and the same sensitivity s which satisfy relationships (5) and (6) respectively at said temperature T. Relationship (7) thus becomes:

$$v_s = \frac{-R_2}{r_0(1+\beta \cdot \delta T)+R_1} \cdot N \cdot s \cdot \frac{\partial i_p}{\partial t}$$

i.e.:

$$v_s = \frac{-R_2}{\left[(r_0+R_1)\left[\frac{1+r_0 \cdot \beta \cdot \delta T}{r_0+R_1}\right]\right]} \cdot N \cdot s_0 \cdot (1+\alpha_2 \cdot \delta T) \cdot \frac{\partial i_p}{\partial t}$$

or indeed:

$$v_s = \frac{-R_2}{r_0+R_1} \cdot S_0 \cdot \frac{\partial i_p}{\partial t} \cdot \left[\frac{1+\alpha_z \cdot \delta T}{\left[\frac{1+r_0 \cdot \beta \cdot \delta T}{r_0+R_1}\right]}\right] \quad (8)$$

It can be seen that if the value $R_1$ is selected so as to satisfy the relationship:

$$\alpha_z = \frac{\beta \cdot r_0}{r_0+R_1} \quad (9)$$

i.e.

$$R_1 = r_0\left(\frac{\beta}{\alpha_z}-1\right)$$

then relationship (8) can be written:

$$v_s = \frac{-R_2}{r_0+R_1} \cdot S_0 \cdot \frac{\delta i_p}{\delta t} \quad (10)$$

Thus, with reference to relationship (2), the overall amplification factor K of the summing acquisition system 7 satisfies the relationship:

$$K = \frac{-R_2}{(r_0+R_1)} \quad (11)$$

or indeed, replacing $R_1$ as a function of relationship (9):

$$K = \frac{-R_2 \alpha_z}{r_0 \beta}$$

In absolute terms, the resistances $R_1$ and $R_2$ are not completely stable with variations in temperature. But in practice, firstly the temperature coefficient of each resistance can be selected to very small (e.g. less than 5 ppm/° C. for a resistance made of NiCr), and secondly the tiny variations in the respective resistances $R_1$ and $R_2$ as a function of temperature take place together and in the same direction, such that the ratio $$\frac{R_2}{(r_0+R_1)}$$

can be considered as being completely stable with temperature. The factor K, and thus the measured signal $v_s$ is thus independent of variations in temperature. The signal $v_s$ is thus a very accurate image of the current $i_p$ carried by the primary conductor 10.

Figure 8:
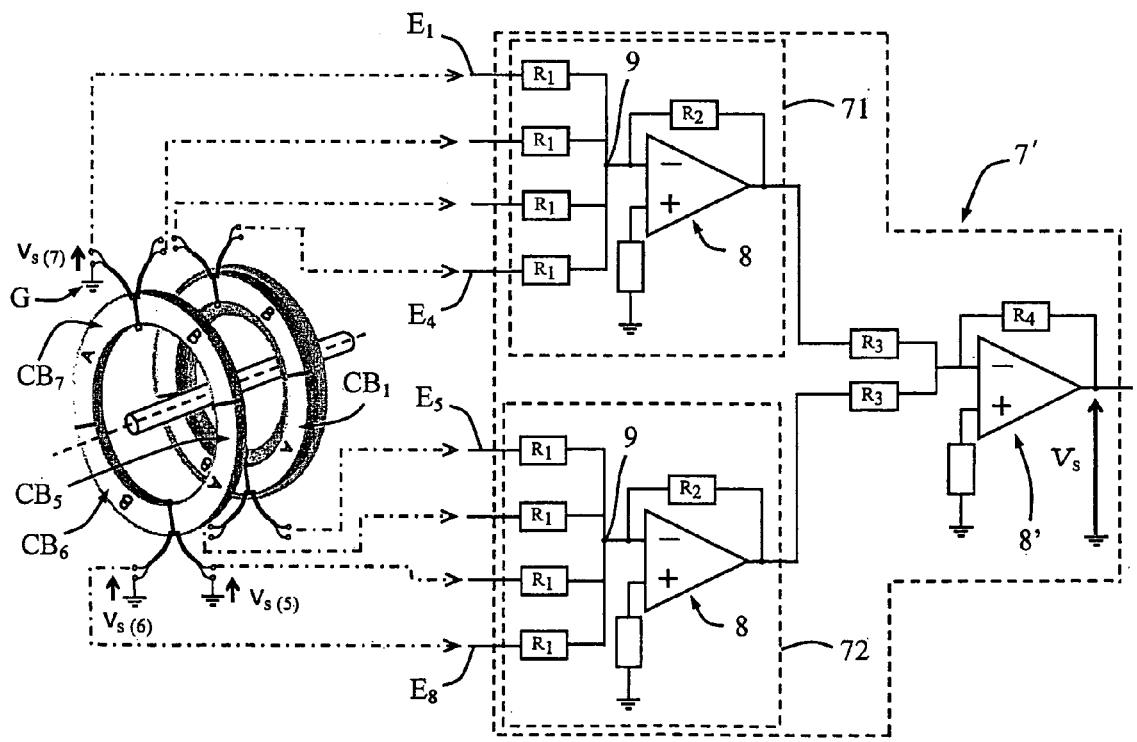
FIG. 8 is the electrical circuit diagram of a current transformer of the invention comprising two complete circuits disposed mutually in parallel, and further comprising a summing acquisition system having two stages of amplification.

FIG. 8 is the electrical circuit diagram of a current transformer of the invention in which two complete circuits are disposed mutually in parallel as explained above with reference to FIGS. 3 and 4. Each complete circuit is a circuit of the kind described above with reference to FIG. 2. It should be understood that the principle which is shown for making electrical connection between the secondary circuit and the summing acquisition system of the transformer can be applied to a number p of complete circuits that is greater than 2.

The summing acquisition system 7' comprises two stages of amplification. A first amplification stage in this case comprises two operational amplifiers 8 each handling half of the emf signals $v_{s(n)}$ of the partial circuits. The first amplification stage is thus constituted by two identical amplifying subassemblies 71 and 72 each analogous to the circuit of the acquisition system 7 shown in FIG. 7. The output from each amplifier 8 in the first stage is connected to a second summing stage designed to produce the complete signal ($v_s$) that is the image of the primary current. This second stage comprises an operational amplifier 8' with a feedback loop for amplifying the sum of the signals produced by the first amplification stage.

The main advantage of this acquisition system 7' is associated with the disposition of the terminals of the partial circuits of the current transformer. Whatever the number p of complete circuits, two diametrically-opposite groups of terminals are obtained. For example, the terminals of the partial circuits $CB_1$, $CB_2$, $CB_5$, and $CB_6$ are close to one another and form the first group, while the terminals of the remaining partial circuits form the diametrically-opposite, second group. Each group of terminals is electrically connected to an amplifying subassembly 71 or 72, and the length of the same-length cables making up the cabling can be particularly short if each subassembly 71 or 72 is disposed beside its own group of terminals. Effective shielding of each cable and also of each amplifying subassembly allocated to a group of terminals can thus be achieved without major difficulty, so that the two groups of signals $v_{s(n)}$ respectively at the inputs $E_1$ to $E_4$ and $E_5$ to $E_8$ of the acquisition system 7' are not disturbed by the electromagnetic fields due to currents flowing in primary conductors adjacent to the current transformer.

The signals $v_{71}$ and $v_{72}$ produced by the first amplification stage satisfy the following relationships:

$$v_{71} = -R_2 \cdot \sum_{n=3,4,7,8} \left[ \frac{S_{(n)} \cdot \frac{\partial i_p}{\partial t}}{(r+R_1)} \right] \quad (12)$$

$$v_{72} = -R_2 \cdot \sum_{n=1,2,5,6} \left[ \frac{S_{(n)} \cdot \frac{\partial i_p}{\partial t}}{(r+R_1)} \right] \quad (13)$$

The complete signal $v_s$ satisfies the following relationship:

$$v_s = \frac{-R_4}{R_3 \cdot (v_{71} + v_{72})} \quad (14)$$

$$= R_2 \cdot \frac{R_4}{R_3(r+R_1)} \cdot \left[ \sum_{n=1}^{4} S_{(n)} + \sum_{n=5}^{8} S_{(n)} \right] \cdot \frac{\partial i_p}{\partial t}$$

i.e.

$$v_s = R_2 \cdot \frac{R_4}{R_3(r+R_1)} \cdot 2S \cdot \frac{\partial i_p}{\partial t}$$

Given that the sensitivity S of a complete circuit and the internal resistance r of a partial circuit satisfy the following relationships respectively:

$$-S = S_0(1+\alpha_z \cdot \delta T) \text{ and } r = r_0(1+\beta \cdot \delta T)$$

it is again possible to select $R_1$ so as to satisfy relationship (9), so that the output voltage $v_s$ from the acquisition system 7' is independent of the temperature T of the complete circuits.

Relationship (14) then becomes:

$$v_s = R_2 \cdot \frac{R_4}{R_3(r_0+R_1)} \cdot 2S_0 \cdot \frac{\partial i_p}{\partial t}$$

The resistances $R_3$ and $R_4$ can be selected to be identical so that the second amplification stage merely sums the output voltages from the first two stages 71 and 72. The above relationship is then written as follows:

$$v_s = \frac{2R_2}{r_0+R_1} \cdot S_0 \cdot \frac{\partial i_p}{\partial t} \quad (15)$$

Comparing relationships (10) and (15) shows clearly that the sensitivity equivalent to two identical complete circuits connected in parallel is equal to twice the sensitivity $S_0$ of one complete circuit. In addition, the advantage of having a plurality of complete circuits disposed mutually in parallel is also to enable an increase in the signal-to-noise ratio for the output signal $v_s$ of the acquisition system. The signal-to-noise ratio for a number p of identical complete circuits is $\sqrt{p}$ times greater than the signal-to-noise ratio for a single complete circuit.

It is not essential to use operational amplifiers for a signal acquisition system provided by the secondary circuit of a current transformer of the invention. The sensitivity of each partial circuit of the secondary circuit may be sufficient to obtain a voltage signal $v_{s(n)}$ that is satisfactory across the terminals of a resistance $R_1$ satisfying relationship (9) and interconnecting two adjacent electrical terminations $T_{1n}$ and $T_{2n}$ of the partial circuit. The N signals $v_{s(n)}$ can then be acquired separately, and each can be conveyed to a summing system (with or without amplification) in order to recreate the secondary signal of the complete circuit formed by the N partial circuits. For example, each voltage signal $v_{s(n)}$ across the terminals of a resistance $R_1$ may be acquired by an analog-to-digital converter, with the digital signal then being conveyed optically to a summing system that can be situated remotely from the secondary circuit.

It is also possible to omit the operational amplifier 8' in the second amplifying/summing stage of the acquisition system 7' shown in FIG. 7. An analog-to-digital converter could be provided at the output from each of the two amplifying sub-assemblies 71 and 72 of the first amplifier stage, and two digital signals can then be transmitted, e.g. optically, to a digital summing system for recreating the signal $v_s$.

Figure 9:
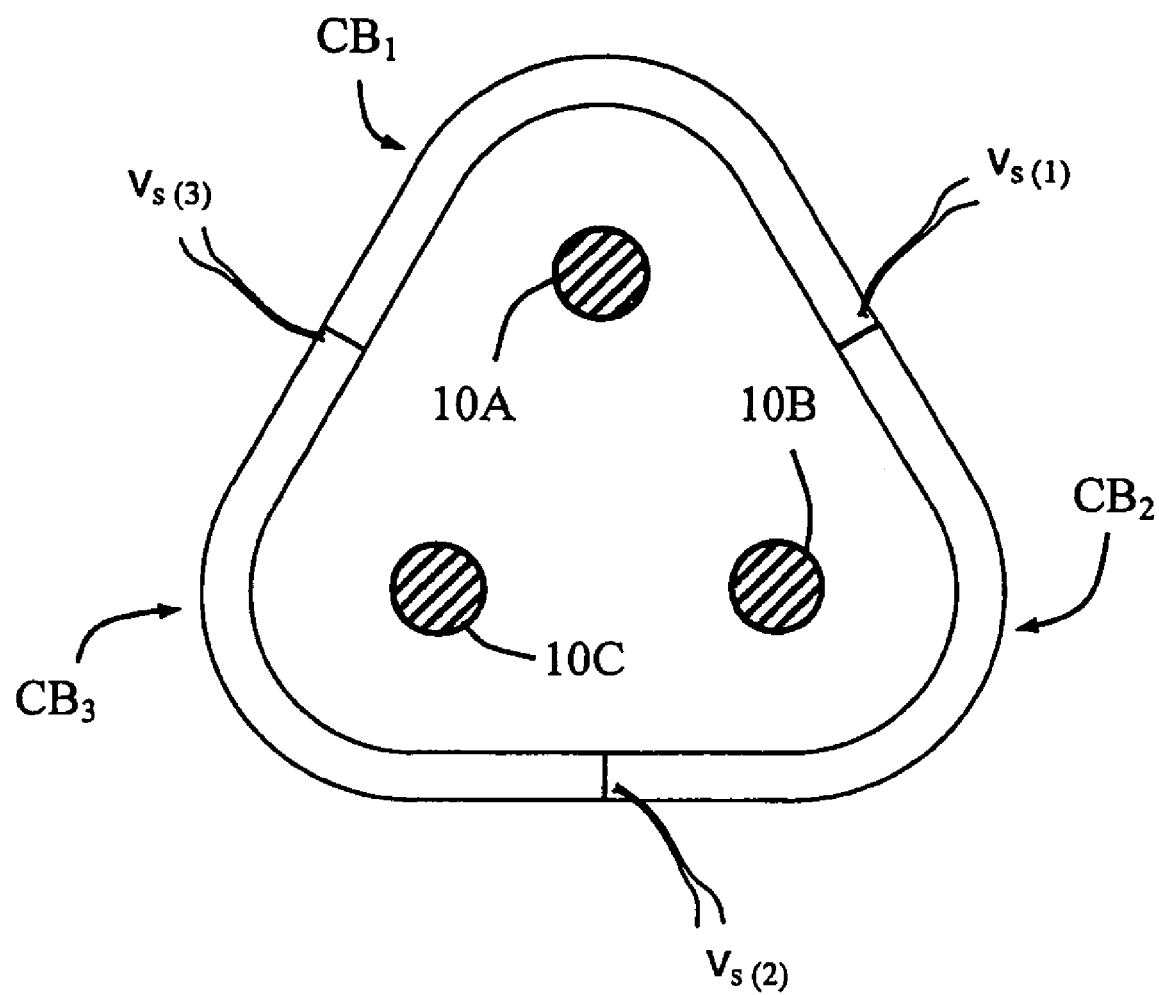
FIG. 9 is a diagram of a current transformer of the invention, applied to detecting any possible residual current in a three-phase line.

A current transformer of the invention can thus be used for detecting any residual current. FIG. 9 is a diagram of a transformer whose secondary circuit is formed by assembling together three partial circuits in order to surround three primary conductors 10A, 10B, and 10C of a three-phase line. The three output voltages $V_{s(1)}$ to $V_{s(3)}$ of the partial circuits $CB_1$ to $CB_3$ should then be summed in phase by an acquisition system in order to obtain a total primary current image $i_p$, i.e. a residual current image which is constituted by the vector sum of the three currents in the three primary conductors. In the absence of any fault current, this vector sum is zero, and the output from the acquisition system thus produces a voltage signal that is substantially zero. However, in the event of an earth fault appearing, the vector sum is no longer zero and the acquisition system then makes it possible to obtain an image of the residual current. Although the accuracy of the measurement system is less good than with a complete circular ring coil as described above, can without difficulty suffice, since measuring residual current usually serves to trigger a protective action. Under such circumstances, there is no need to have measurement accuracy in the 0.1% class.

The invention claimed is:

1. A current transformer comprising at least two partial circuits ($CB_1$, $CB_2$, . . . , $CB_n$, . . . , $CB_N$) each comprising a Rogowski type winding ($C_1$, $C_2$, . . . , $C_n$, . . . , $C_N$), each of said partial circuits being made in the form of an angular portion of a complete circuit (CB) which surrounds at least one primary conductor (10, 10A, 10B, 10C) of the transformer over 360°, said complete circuit having the function of a Rogowski type secondary circuit for the transformer, the winding ($C_n$) of each partial circuit ($CB_n$) comprising a go winding ($C_{n0}$) electrically connected to a return winding ($C_{n1}$), said go and return windings being arranged in an interleaved pattern over a significant portion of an angular extent ($\theta_n$) of the partial circuit ($CB_n$) but substantially less than an entire angular extent of the complete circuit (CB), wherein, for each partial circuit ($CB_n$), said go and return windings ($C_{n0}$, $C_{n1}$) are electrically connected in series, the go winding ($C_{n0}$) comprising turns wound in a first winding direction as the go winding ($C_{n0}$) advances in a first direction along the angular extent ($\theta_n$) of the partial circuit ($CB_n$) from adjacent a first angular end ($E_{1n}$) towards a second angular end ($E_{2n}$), and the return winding ($C_{n1}$) comprising turns wound in a second winding direction as the return winding ($C_{n1}$) advances in a second direction along the angular extent ($\theta_n$) of the partial circuit ($CB_n$) from adjacent the second angular end ($E_{2n}$) towards the first angular end ($E_{1n}$), wherein the first and second winding directions are the same, so as to form said winding ($C_n$) and present a pair of adjacent electrical terminations ($T_{1n}$, $T_{2n}$) for each partial circuit ($CB_n$), the pairs of electrical terminations ($T_{1n}$, $T_{2n}$) of said windings ($C_n$) being connected to an acquisition system (7, 7') designed to produce a complete signal ($v_s$) which is indicative of an electric current being conducted through the at least one primary conductor (10, 10A, 10B, 10C) of the transformer, and wherein, for each partial circuit ($CB_n$), one of the two electrical terminations ($T_{1n}$, $T_{2n}$) of the winding is electrically connected to a common reference potential (G), while the other termination is electrically connected to an input ($E_n$) of the acquisition system.

2. A current transformer according to claim 1, in which the pair of electrical terminations ($T_{1n}$, $T_{2n}$) of the partial circuit ($CB_n$) is disposed at one of the first and second angular ends ($E_{1n}$, $E_{2n}$) of the partial circuit ($CB_n$), the go and return windings ($C_{n0}$, $C_{n1}$) each extending along the angular extent ($\theta_n$) of the partial circuit ($CB_n$) and being electrically connected in series at the other angular end of said partial circuit ($CB_n$).

3. A current transformer according to claim 1 or claim 2, in which each partial circuit ($CB_1$, $CB_2$, ..., $CB_N$) is made in the form of a plane or curved pcb having a series (31, 32) of metal tracks on each of its two faces, the tracks of one series (31) being electrically connected to the tracks of the other series (32) via plated-through holes (6) passing thorough said pcb to form the winding ($C_n$) of said partial circuit ($CB_n$), wherein the series (31, 32) of metal tracks of each partial circuit ($CB_1$, $CB_2$, ..., $CB_N$) is electrically independent of the series (31, 32) of metal tracks of other partial circuits ($CB_1$, $CB_2$, ..., $CB_N$) for measurement of the complete signal ($v_s$) with the pair of adjacent electrical terminations ($T_{1n}$, $T_{2n}$) of each partial circuit ($CB_1$, $CB_2$, ..., $CB_N$).

4. A current transformer according to claim 3, in which said pcb comprises a substrate layer of constant thickness between the two series (31, 32) of metal tracks, a first half of the track in each series being used for the go winding ($C_{n0}$) while the other half is used for the return winding ($C_{n1}$) of the partial circuit.

5. A current transformer according to claim 4, in which each partial circuit ($CB_1$, $CB_2$, ..., $CB_N$) is in the form of an angular portion of a plane ring so as to form a complete ring circuit (CB), and each series (31, 32) of metal tracks of a pcb is made with tracks that are substantially rectilinear extending along radii which when extended pass through an axis (Z) perpendicular to the ring at its center (O).

6. A current transformer according to claim 4, in which each pcb is in the form of an angular portion of a tubular ring whose axis of symmetry coincides with the axis (Z) of the primary conductor of the transformer, and in which the metal tracks of a printed circuit are parallel to said axis (Z) of the primary conductor.

7. A current transformer according to claim 4, in which the complete circuit is mounted on a plane frame (15) having at least one primary conductor (10) of the transformer passing perpendicularly therethrough, and in which fasteners (16) having resilient return properties are provided for holding the adjacent angular ends of the pcbs against one another.

8. A current transformer according to claim 1 or claim 2, in which each partial circuit ($CB_1$, $CB_2$, ..., $CB_N$) is made from two substrate boards (3, 4), each board having on each of its two faces one series (41, 42; 51, 52) of metal tracks, the tracks of one series (41; 51) on one plate being electrically connected with the tracks of the other series (42; 52) on the same plate via plated-through holes to form either a go winding ($C_{n0}$) or a return winding ($C_{n1}$) of said partial circuit ($CB_n$).

9. A current transformer according to claim 1, in which a pair of electrical terminations ($T_{1n}$, $T_{2n}$) of a partial circuit ($CB_n$) is disposed at one of two angular ends ($E_{1n}$, $E_{2n}$) of the partial circuit, the go and return windings ($C_{n0}$, $C_{n1}$) each extending along the angular extent ($\theta_n$) of the partial circuit ($CB_n$) and being electrically connected in series at the other angular end of said partial circuit, in which each partial circuit ($CB_1$, $CB_2$, ..., $CB_N$) is made in the form of a plane or curved pcb having a series (31, 32) of metal tracks on each of its two faces, the tracks of one series (31) being electrically connected to the tracks of the other series (32) via plated-through holes (6) passing thorough said pcb to form the winding ($C_n$) of said partial circuit ($CB_n$), in which said pcb comprises a substrate layer of constant thickness between the two series (31, 32) of metal tracks, a first half of the track in each series being used for the go winding ($C_{n0}$) while the other half is used for the return winding ($C_{n1}$) of the partial circuit, in which each partial circuit ($CB_1$, $CB_2$, ..., $CB_N$) is in the form of an angular portion of a plane ring so as to form a complete ring circuit (CB), and each series (31, 32) of metal tracks of a pcb is made with tracks that are substantially rectilinear extending along radii which when extended pass through an axis (Z) perpendicular to the ring at its center (O), and in which the complete ring circuit (CB) is made up of at least four identical partial circuits ($CB_1$, $CB_2$, $CB_3$, $CB_4$) whose faces on one side of the ring alternate in pairs, so that one pair of electrical terminations ($T_{1n}$, $T_{2n}$) of the winding of a first partial circuit is disposed next to another pair of electrical terminations of one of the two partial circuits adjacent to said first partial circuit.

10. A current transformer according to claim 1, wherein said acquisition system (7, 7') has a summing and amplification function and includes at least one operational amplifier (8).

11. A current transformer according to claim 10, in which the partial circuits ($CB_n$) are identical, and each input ($E_n$) of the acquisition system (7, 7') is connected to an input (9) of said operational amplifier (8) via a resistor of resistance $R_1$ selected to satisfy the relationship:

$$R_1 = r_0\left(\frac{\beta}{\alpha_z} - 1\right)$$

where $\alpha_z$ is the temperature coefficient of the sensitivity ($s_n$) of the Rogowski coil formed by said winding ($C_n$), $\beta$ is the temperature coefficient of the resistivity of the material constituting the winding ($C_n$) of a partial circuit ($CB_n$), and $r_0$ is the internal resistance of said winding ($C_n$) at a given reference temperature ($T_0$); in such a manner that the signal from the complete circuit (CB), once amplified by the acquisition system (7, 7') is independent of variations in the temperature (T) of the transformer.

12. A current transformer according to claim 10 or claim 11, in which the voltage signals ($v_{s(n)}$) output by the partial circuits are summed in phase by the acquisition system (7, 7').

13. A current transformer according to claim 11, characterized in that it comprises a plurality (p) of complete circuits (CB) disposed mutually in parallel, in which the acquisition system (7) includes an amplifier circuit comprising an operational amplifier (8) having one input (9) connected to each of the partial circuits ($CB_n$) making up the complete circuits (CB).

14. A current transformer according to claim 11, characterized in that it comprises a plurality (p) of complete circuits (CB) disposed mutually in parallel, in which the acquisition system (7') comprises a first amplification stage (71, 72) comprising at least two operational amplifiers (8), the output from each amplifier (8) of said first stage being connected to a summing second stage provided for producing said complete signal ($v_s$).

15. A current transformer according to claim 14, in which the summing second stage comprises an operational amplifier (8') with a feedback loop for amplifying the sum of the signals produced by the amplifier first stage.

16. A current transformer according to claim 1, characterized in that it comprises a plurality (p) of complete circuits (CB) disposed mutually in parallel.

17. The current transformer of claim 1, wherein each partial circuit ($CB_1$, $CB_2$, ..., $CB_N$) comprises a first series (31) of metal tracks on a first face and a second series (32) of metal tracks on a second face, the metal tracks of the first series (31) being electrically connected to the metal tracks of the second series (32), wherein
at least two partial circuits ($CB_1$, $CB_2$, ..., $CB_N$) are arranged with alternating first and second faces to position the pair of adjacent electrical terminations ($T_{1n}$, $T_{2n}$) of a first of the at least two partial circuits ($CB_1$, $CB_2$, ..., $CB_N$) adjacent to the pair of adjacent electrical terminations ($T_{1n}$, $T_{2n}$) of a second of the at least two partial circuits ($CB_1$, $CB_2$, ..., $CB_N$) forming the complete circuit (CB).

18. The current transformer of claim 17, wherein each of the partial circuits ($CB_1$, $CB_2$, ..., $CB_N$) forming the complete circuit (CB) are substantially identical.

19. A current transformer comprising:
a first complete ring type secondary conductor for encircling a primary conductor, said first complete ring type secondary conductor being coupled to a frame comprising an electrically conductive material;
a second complete ring type secondary conductor arranged in parallel with the first complete ring type secondary conductor for encircling the primary conductor; and
a shield formed from an electrically conductive material interposed between the first and second complete ring type secondary conductors, wherein
each of the first and second complete ring type secondary conductors comprises:
a plurality of Rogowski type windings forming a plurality of partial circuits, each of said plurality of Rogowski type windings comprising a go winding electrically connected in series with a return winding, the go winding and the return winding being wound in a same winding direction as the go winding and return winding advance in different directions along an angular extent of the partial circuit, wherein the go and return windings of each partial circuit extend significantly less than an entire angular extent of the complete ring circuit, and
a first terminal adjacent to a second terminal to collectively form adjacent electrical terminations of the go and return windings of each of the partial circuits to electrically connect the Rogowski type winding supported by each of the partial circuits to an acquisition system operable to produce a signal indicative of an electric current being conducted through the primary conductor of the current transformer.

20. The current transformer of claim 19 further comprising a polymeric film interposed between the shield and at least one of the first and second complete ring type secondary conductors.

21. The current transformer of claim 20, wherein the polymeric film comprises polyethylene terephthalate.

22. A current transformer comprising:
a first complete ring type secondary conductor for encircling a primary conductor, said first complete ring type secondary conductor being coupled to a frame comprising an electrically conductive material;
a second complete ring type secondary conductor arranged in parallel with the first complete ring type secondary conductor for encircling the primary conductor; and
a layer of an insulating material interposed between the first and second complete ring type secondary conductors, wherein
each of the first and second complete ring type secondary conductors comprises:
a plurality of Rogowski type windings each forming a partial circuit, each of said plurality of Rogowski type windings comprising a go winding electrically connected in series with a return winding, the go winding and the return winding being wound in a same winding direction as the go winding and return winding advance in different directions along an angular extent of the partial circuit, wherein the go and return windings of each partial circuit extend significantly less than an entire angular extent of the complete ring circuit, and
a first terminal adjacent to a second terminal to collectively form adjacent electrical terminations of the go and return windings of each of the partial circuits to electrically connect the Rogowski type winding supported by each of the angular substrates to an acquisition system operable to produce a signal indicative of an electric current being conducted through the primary conductor of the current transformer.

23. The current transformer of claim 22, wherein each of the first and second complete ring type secondary conductors comprises a substrate supporting metallic tracks, wherein a coefficient of expansion of the layer of the insulating material is close to or equal to a coefficient of expansion of the substrate.

24. The current transformer of claim 22, wherein the plurality of Rogowski type windings comprises more that two Rogowski type windings forming more that two partial circuits.

* * * * *